(12) United States Patent
Cheng et al.

(10) Patent No.: US 6,515,541 B2
(45) Date of Patent: Feb. 4, 2003

(54) MULTI-LEVEL POWER AMPLIFIER

(75) Inventors: Naishuo Cheng, Simi Valley, CA (US); Kevin Choi, Thousand Oaks, CA (US); Mark Bloom, Chandler, AZ (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/880,286

(22) Filed: Jun. 13, 2001

(65) Prior Publication Data

US 2002/0190790 A1 Dec. 19, 2002

(51) Int. Cl.[7] .................................................. H03F 1/14
(52) U.S. Cl. ..................................... 330/51; 330/124 R
(58) Field of Search ........................ 330/51, 53, 124 R, 330/129, 295; 333/156

(56) References Cited

U.S. PATENT DOCUMENTS

| | | | | |
|---|---|---|---|---|
| 4,053,848 A | * | 10/1977 | Kleische | .......................... 330/53 |
| 4,398,161 A | * | 8/1983 | Lamb et al. | .................. 333/156 |
| 5,083,094 A | * | 1/1992 | Forsberg | ................... 330/124 R |
| 6,078,228 A | * | 6/2000 | Mannerstrale | ............... 333/139 |
| 6,137,355 A | * | 10/2000 | Sevic et al. | ..................... 330/51 |

* cited by examiner

Primary Examiner—Robert Pascal
Assistant Examiner—Henry Choe
(74) Attorney, Agent, or Firm—Thomas, Kayden, Horstemeyer & Risley, LLP

(57) ABSTRACT

A high efficiency, multiple power output power amplifier uses a pair of amplifiers having similar characteristics coupled to a pair of radio frequency RF couplers. When both amplifiers are operating, the power output is the sum of the outputs of the two amplifiers. When lower power operation is desired, one of the amplifiers is turned off and a high impedance is presented to the isolated port of the output RF coupler, thereby ensuring that all of the power output of the remaining power amplifier is available for output.

20 Claims, 5 Drawing Sheets

MULTI-LEVEL POWER AMPLIFIER

CROSS REFERENCE TO RELATED APPLICATIONS

This application relates to and further describes other aspects of the embodiments disclosed in the following co-pending and commonly assigned U.S. Patent application, and is incorporated by reference in its entirety.

U.S. patent application Ser. No. 09/686,440, "HIGH EFFICIENCY MULTIPLE POWER LEVEL AMPLIFIER," Attorney Reference Number: 99RSS386, filed on Oct. 10, 2000.

BACKGROUND OF THE INVENTION

1. Field of the Invention

This invention relates generally to maximizing the efficiency of radio frequency power amplification in a wireless communication device transmitter, and, more particularly, to a high efficiency multi-level power amplifier.

2. Related Art

With the increasing availability of efficient low cost electronic modules, mobile communication systems are becoming more widespread. For example, there are many variations of communication schemes in which various frequencies, transmission schemes, modulation techniques and communication protocols are used to provide two-way voice and data communications in a hand-held telephone-like wireless communication handset. While the different modulation and transmission schemes each have advantages and disadvantages, one common factor is the need for highly efficient power amplification. As these communication devices become smaller, the benefits provided by highly efficient power amplifiers becomes increasingly important. One significant concern when developing these handheld communication devices is power consumption. A high efficiency power system decreases the amount of power consumed, thereby maximizing the power source life of the device.

Another concern in these wireless devices is the size of the circuitry. In order to minimize the size of the wireless communication device, it is desirable to integrate as much functionality as possible into fewer and fewer circuit modules. This enables the wireless communication device to be smaller. Integrating components also provides the benefit of less power consumption. Smaller wireless communication devices are more desirable by consumers in the marketplace.

Most power amplifier systems employed in wireless communication devices must operate efficiently over a broad range of operating power levels. Efficient operation is inherently difficult to achieve without complex circuitry and logic to control the power amplifier(s). Typically, additional circuitry residing on a control die must be used to control the power amplifier circuit. However, this additional circuitry requires additional space, thereby making the wireless communication device larger, and utilizes additional power. Also, this circuitry adds additional cost to each unit.

One conventional manner to achieve high efficiency power amplification over a broad range of power output levels uses radio frequency (RF) switches to select different power amplifiers based upon the required power output demand. Each of the power amplifiers is optimized for high efficiency at different power levels. Unfortunately, this technique requires the use of an additional control die to house the RF switches. The control die results in an additional cost per unit, increases the size of the wireless communication device, and also consumes additional power.

Another conventional manner to achieve high efficiency power amplification over a broad range of power output levels involves two separate amplifiers, each amplifier having different characteristics and each amplifier optimized for high efficiency at different power levels. In such an arrangement, the amplifiers could be activated separately with separate control dies to satisfy the required power levels. a hat is, only one of the two power amplifiers is on at any given time. Microwave couplers may be used to ensure the correct phase match between the two amplifiers. Unfortunately, this technique still requires a separate control die. Furthermore, the two different amplifiers must have a matched phase supplied at their input, thereby requiring that the microwave couplers be extremely stable.

Therefore, there is a continuing effort in the industry to develop a wireless power amplification circuit that achieves highly efficient power amplification over a broad range of output power levels and that is economical to mass produce in high volume.

SUMMARY

The invention provides a high efficiency multi-level power amplifier that maximizes power amplifier efficiency and minimizes the required control circuitry. Thus, the invention increases the power efficiency of a power amplifier circuit by integrating many of the power amplifier components and control circuitry onto an integrated circuit (IC). Also, the integration of all components onto a single IC simultaneously minimizes the amount of control circuitry required to control the amplifier, thereby allowing a reduction in size of the wireless device. Furthermore, the single IC may reduce the manufacturing cost of each wireless device.

The high efficiency multi-level power amplifier utilizes two amplifiers having different amplification characteristics that are connected to two RF couplers. The power amplifier circuit uses both amplifiers when power demand is high and uses the output of a single power amplifier when power demand is lower. By utilizing power amplifiers having different amplification characteristics, the output of the wireless device when operating in the low power operating condition is set to an optimized level for a low power operation mode and is set to another optimized level for a high power operation mode.

In another embodiment, the multi-level power amplifier is configured such that the isolated port of each RF coupler is connected to an impedance modification circuit. When using only one power amplifier, the impedance modification circuit eliminates the impedance mismatch caused by the single power amplifier operation by using an externally biased semiconductor to present the proper impedance to the coupler connected to the inactive power amplifier. In this manner, any impedance mismatch between the operative and inoperative power amplifiers is compensated, thus allowing the single operating power amplifier to achieve optimal performance. Related practices of operation and computer readable media are also provided.

Other systems, methods, features and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon clearly illustrating the principles of the invention. In the figures, like reference numerals designate corresponding parts throughout the different views.

DETAILED DESCRIPTION

1. Overview

Figure 1:
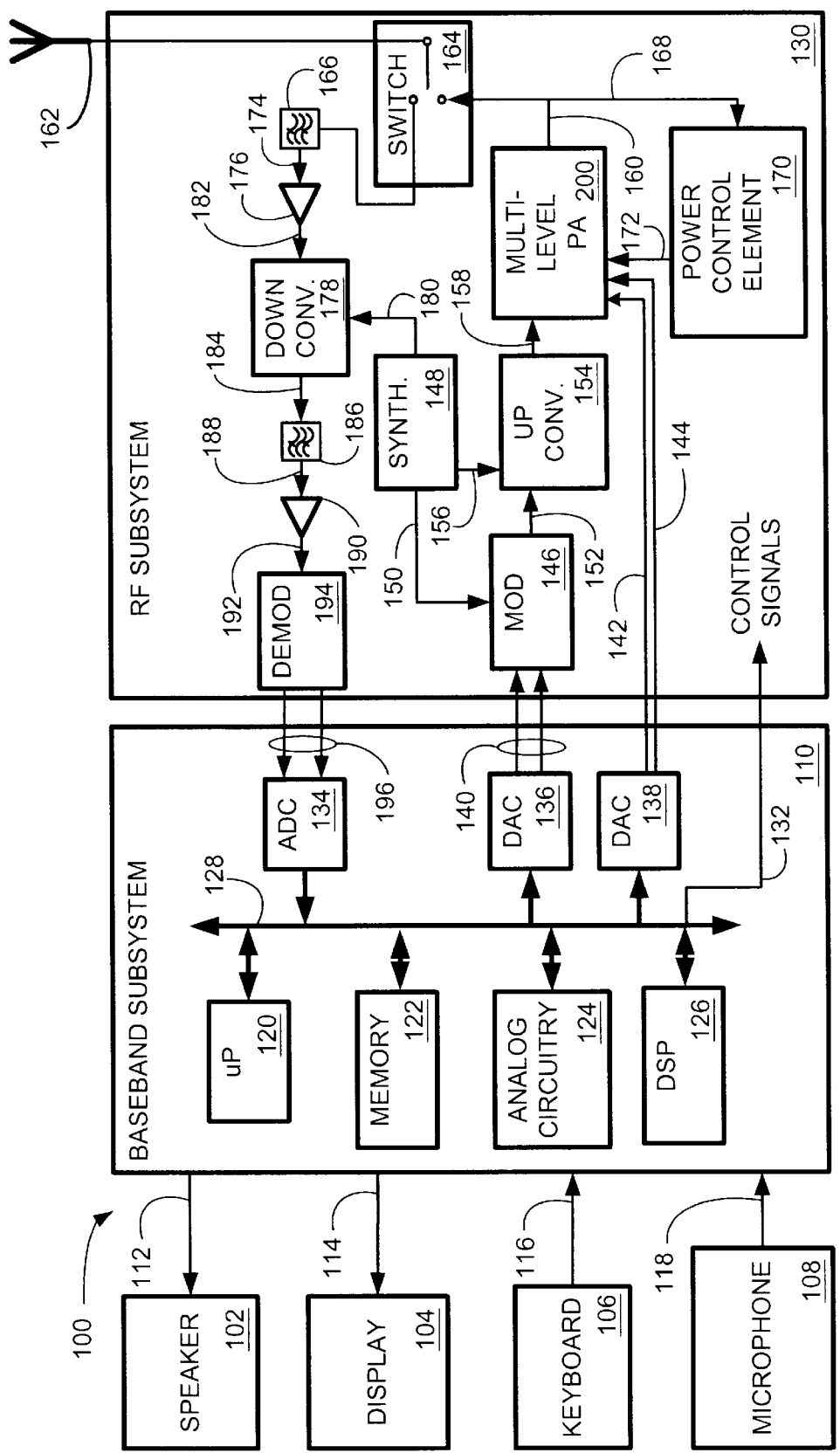
FIG. 1 is a block diagram illustrating selected components of a portable communication device.

Although described with particular reference to a transceiver employed in a wireless communication device, the high efficiency multi-level power amplifier can be implemented in any system where it is desirable to have both high and low power amplification, and where the low power amplification operating point is not equal to 50% of the high level power amplification operating point. Furthermore, the high efficiency multi-level power amplifier can be implemented in software, hardware, or a combination of software and hardware. In at least one embodiment, selected portions of the high efficiency multi-level power amplifier are implemented in hardware and software. The hardware portion of the invention can be implemented using specialized hardware logic. The software portion can be stored in a memory and be executed by a suitable instruction execution system (microprocessor). The hardware implementation of the high efficiency multi-level power amplifier can include any or a combination of the following technologies, that are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the high efficiency multi-level power amplifier software, that comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

2. Example Environment

FIG. 1 is a block diagram illustrating selected components of a portable communication device 100. Wireless communication device 100 includes a speaker 102, an optional display 104, a keyboard 106, and a microphone 108, all connected to baseband subsystem 110. For convenience of illustration, connections between components in the baseband subsystem 110 and the speaker 102, display 104, keyboard 106 and microphone 108 are not shown in detail. However, one skilled in the art will readily understand the detailed connection requirements that connect the above components to the baseband subsystem 110. In a particular embodiment wireless communication device 100 can be, for example but not limited to, a portable telecommunication handset such as a mobile cellular-type telephone.

Speaker 102 and display 104 receive signals from baseband subsystem 110 via connections 112 and 114, respectively. Similarly, keyboard 106 and microphone 108 supply signals to baseband subsystem 110 via connections 116 and 118, respectively. Baseband subsystem 110 includes at least a microprocessor ($\mu$P) 120, a memory 122, analog circuitry 124, and a digital signal processor (DSP) 126 in communication via bus 128. Bus 128, although shown as a single bus, may be implemented using multiple busses connected as necessary among the subsystems within baseband subsystem 110.

Microprocessor 120 and memory 122 provide the signal timing, processing and storage functions for wireless communication device 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of wireless communication device 100 are illustrated. Detailed operation of these individual components are not described in detail other than to the extent necessary to understand the operation and functioning of these components with respect to the invention. One skilled in the art will realize that a wireless communication device 100 or other system employing the multi-level power amplifier 200 (see also FIG. 2) may have the component shown in FIG. 1 connected in a different order and manner than shown in FIG. 1, or may not include all of the components shown in FIG. 1, or may include additional components connected in some alternative manner with the component shown in FIG. 1. Any such variations of a wireless communication device 100 or other system that utilizes the multi-level power amplifier 200 are intended to be within the scope of this disclosure and to be protected by the accompanying claims.

Baseband subsystem 110 also includes analog-to-digital converter (ADC) 134 and digital-to-analog converters (DACs) 136 and 138. ADC 134, DAC 136 and DAC 138 communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to the two amplifiers 214 and 216 residing in the multi-level power amplifier 200, via connections 142 and 144, respectively. Connection 140, shown as two lines having directed arrows, includes the information that is to be transmitted by RF subsystem 130 after conversion from the digital domain to the analog domain.

RF subsystem 130 includes modulator 146. Modulator 146, after receiving a frequency reference signal, also called a local oscillator signal or LO from synthesizer 148, via connection 150, modulates the analog information connection 140 and provides a modulated signal via connection 152 to upconverter 154. Upconverter 154 also receives a frequency reference signal from synthesizer 148 via connection 156. Synthesizer 148 determines the appropriate frequency that upconverter 154 upconverts the modulated signal on connection 152. The modulated signal on connection 152 may be any modulated signal, such as, but not limited to, a phase modulated signal or an amplitude modulated signal. Furthermore, it is possible to supply a phase modulated signal to upconverter 154 and to introduce an amplitude modulated signal component into multi-level power amplifier 200 through the power amplifier's control channel. Most modulation techniques benefit from the invention described below.

Upconverter 154 supplies the modulated signal via connection 158 to multi-level power amplifier 200. Multi-level power amplifier 200 amplifies the signal on connection 158 to different power levels while maintaining a high efficiency level. Multi-level power amplifier 200 amplifies the modulated signal on connection 158 to the appropriate power level for transmission via connection 160 to antenna 162. Illustratively, switch 164 controls whether the amplified signal on connection 160 is transferred to antenna 162 or whether a received signal from antenna 162 is supplied to filter 166. The operation of switch 164 is controlled by a control signal from baseband subsystem 110 via connection 132.

A portion of the amplified transmit signal energy on connection 160 is supplied via connection 168 to power control element 170. Power control element 170 forms a closed power control feedback loop and, if desired, supplies an AM component of the transmit signal via control channel connection 172 to multi-level power amplifier 200.

As described above, a signal received by antenna 162, at the appropriate time determined by baseband system 110, is directed via switch 164 to receive filter 166. Receive filter 166 filters the received signal and supplies the filtered signal on connection 174 to low noise amplifier (LNA) 176. Receive filter 166 is a bandpass filter that passes all channels of the particular cellular system that the wireless communication device 100 is operating. As an example, in a 900 MHz GSM system, receive filter 166 passes all frequencies from 935.1 MHz to 959.9 MHz, covering all 124 contiguous channels of 200 kHz each. The purpose of this filter is to reject all frequencies outside the desired region. LNA 176 amplifies the very weak signal on connection 174 to a level that downconverter 178 translates to a baseband frequency. Alternatively, the functionality of LNA 151 and downconverter 178 cap be accomplished using other elements, such as, but not limited to, a low noise block (LNB) downconverter.

Downconverter 178 receives a frequency reference signal, also called a local oscillator (LO) signal from synthesizer 148, via connection 180. This LO signal instructs the downconverter 178 as to the proper frequency to downconvert the signal received from LNA 176 via connection 182. The downconverted frequency is called the intermediate frequency or "IF". Downconverter 178 sends the downconverted signal via connection 184 to channel filter 186, also called the "IF filter". Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. Alter all channels are passed by receive filter 166 and downconverted in frequency by downconverter 178, only the one desired channel appears precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers it via bus 128 to DSP 126 for further processing.

3. Multi-Level Power Amplifier

Figure 2:
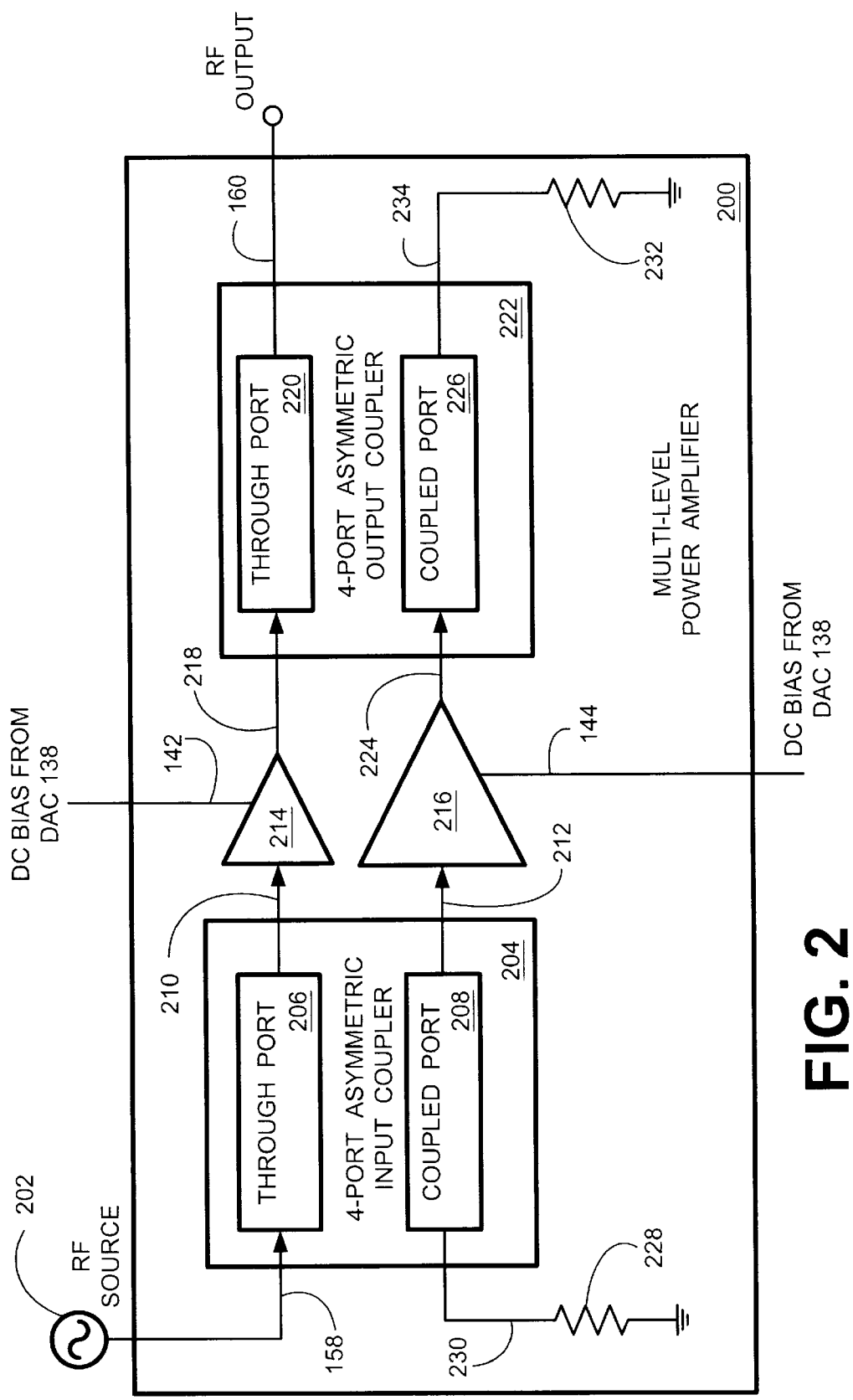
FIG. 2 is a block diagram illustrating an embodiment of the multi-level power amplifier of FIG. 1.

FIG. 2 is a block diagram illustrating an embodiment of the multi-level power amplifier 200 of FIG. 1. RF source 202 (FIG. 2) is illustrated for convenience as an oscillator that includes the functionality of modulator 146 and upconverter 154 (FIG. 1) RF source 202 supplies a modulated and upconverted signal via connection 158 to input coupler 204. Input coupler 204 is a four-port asymmetric quadrature hybrid coupler. Alternatively, input coupler may be any other type of well known RF coupling device capable of splitting and combining RF energy. Input coupler 204 includes a through port 206 and a coupled port 208. The through port 206 imparts a 0° phase shift on the signal on connection 210 and the coupled port 208 imparts a −90° phase shift on the signal on connection 212. The through port 206 of input coupler 204 connects to an input of first amplifier 214 via connection 210. The coupled port of input coupler 204 connects to an input of second amplifier 216 via connection 212.

Amplifiers 214 and 216 each receive a direct current (DC) bias signal via connections 142 and 144, respectively, from the DAC 138 (FIG. 1). The bias signal communicated over connections 142 and 144 may be different signals, or may be the same signal, depending on the particular application that the invention is employed. Amplifier 214 and amplifier 216 have different operating characteristics. The DC bias signals provided from DAC 138 over connections 142 and 144 control the operation of amplifiers 214 and 216, respectively, and determines whether the amplifiers 214 and 216 are on or off. First amplifier 214 connects, via connection 218, to the through port 220 of output coupler 222. Second amplifier 216 connects via connection 224 to the coupled port 226 of output coupler 222. Output coupler 222 is also a four-port asymmetric quadrature hybrid coupler, similar in function to input coupler 204. Output coupler 222 may be identical to the input coupler 204, or may be configured differently depending upon the particular application that multi-level power amplifier 200 is employed. Alternatively, output coupler 222 may be any other type of well known RF coupling device capable of splitting and combining RF energy.

The input to coupled port 208 is connected to a resistor 228 via connection 230. The output of coupled port 226 is connected to a resistor 232 via connection 234. Resistors 228 and 232 are connected to ground. Resistors 228 and 232, known as terminating resistors, provide a high impedance Such that amplifier 214 operates more efficiently when amplifier 216 is off. (The on and off functionality of amplifier 216 is described below.)

As mentioned above, first amplifier 214 and second amplifier 216 have different operating characteristics. When both amplifier 214 and amplifier 216 are operating, the output present at connection 160 is substantially the sum of the outputs of each amplifier 214 and 216. However, there are conditions when it is desirable to provide less than full power output. For example, when conditions permit, it is desirable to have a lower power output to conserve power while still maintaining amplifier output efficiency. For example, wireless communication device 100 (FIG. 1) may have been moved closer to the base station receiver (not shown). Since a lower strength communication signal would be adequate, output power could be reduced to conserve power. Second amplifier 216 is turned off by changing the signal from the DC bias from DAC 138 via connection 144. Thus, first amplifier 214 is operating alone and providing the entire power amplification for the communication signal.

First amplifier 214 is selected based upon the particular operating characteristics specified by the designer when the wireless communication device 100 is to be operating in the low power operating mode. Such operating characteristics may include quiescent current specifications and efficiency ratings at various power level outputs.

Second amplifier 216 is then determined based upon the desired operating characteristics when the wireless communication device 100 is operated in the high power mode. The sum of the characteristics of the first amplifier 214 and the second amplifier 216 (such as quiescent current and efficiency ratings) determine operating characteristics at the high power operating mode. Second amplifier 216 then could be specified by the designer.

One skilled in the art will realize that once specified, the first amplifier 214 and the second amplifier 216 may be conveniently selected from a plurality of standardized parts to economically facilitate manufacturing and assembly. Alternatively, first amplifier 214 and/or second amplifier 216 may be specially fabricated amplifiers having the operating characteristics specified by the designer.

Power efficiency and reduced size may be realized during the fabrication process by installing the input coupler 204, output coupler 222, resistors 228 and 232, first amplifier 214 and/or second amplifier 216 onto a single printed circuit board (PCB), thereby creating a small modularized component that is easy to install into a wireless communication device 100 (FIG. 1) or other similarly functioning device. Also, many of the elements above may be incorporated into a single integrated circuit (IC) chip, further facilitating a reduction in size of the wireless device 100.

4. Embodiment of a Multi-Level Power Amplifier

Figure 3:
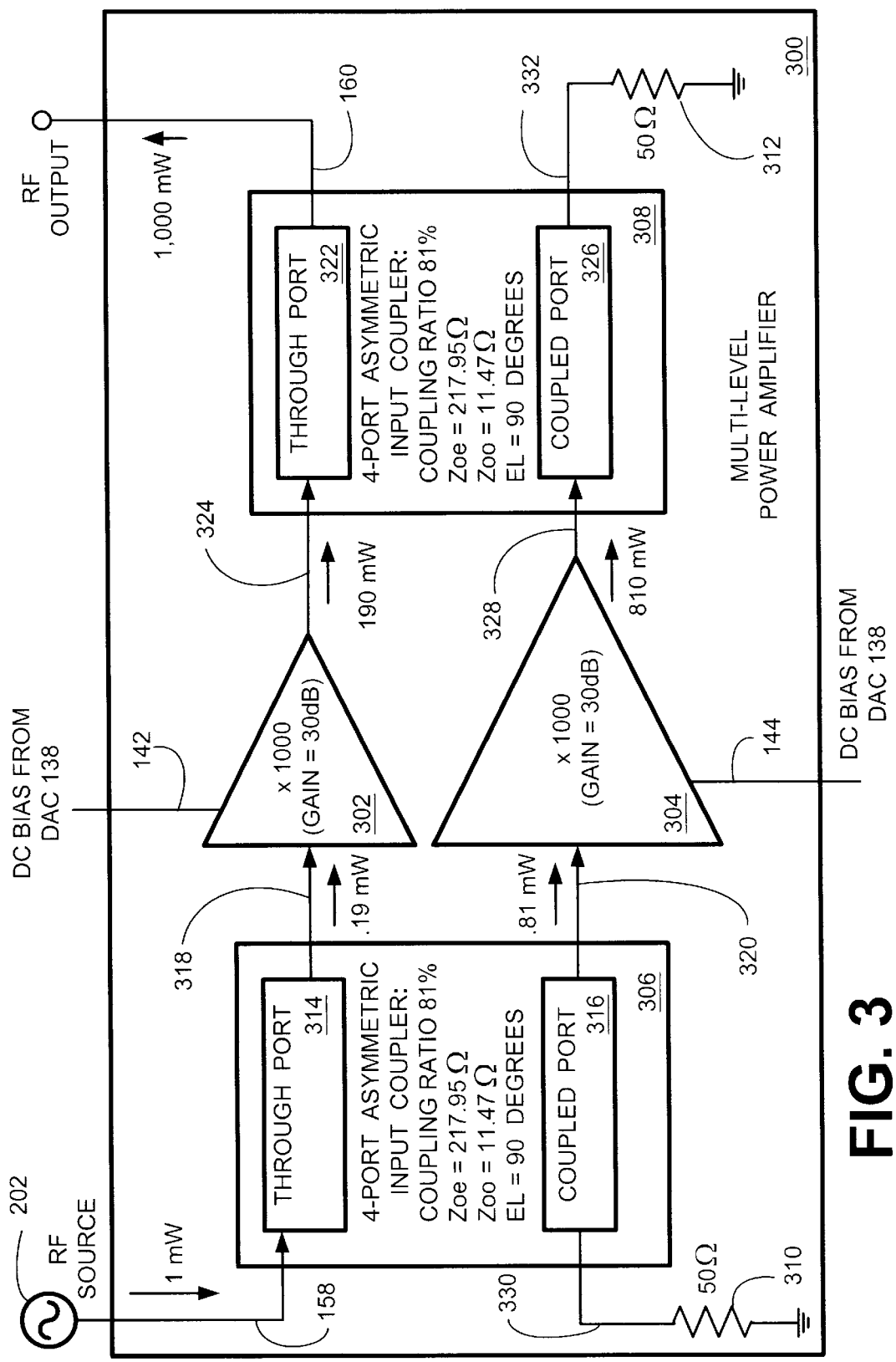
FIG. 3 is a block diagram illustrating an embodiment of the multi-level power amplifier.

FIG. 3 is a block diagram illustrating an embodiment of the multi-level power amplifier 300. Multi-level power amplifier 300 is configured substantially according to the multi-level power amplifier 200 of FIG. 2. multi-level power amplifier 300 has a first amplifier 302, a second amplifier 304, an input coupler 306, an output coupler 308, and termination resistors 310 and 312.

An RF signal from RF source 202 is provided to input coupler 306 via connection 158. The amplified output RF signal is provided to the RF output via connection 160. The RF source signal is amplified in a high power mode when first amplifier 302 and second amplifier 304 are amplifying the RF source signal, or in a low power mode when only first amplifier 302 is amplifying the RF source signal. Amplifiers 302 and 304 have an amplification factor of 1,000 (×1000). The amplification factor of amplifiers 302 and 304 approximately equates to a gain of 30 decibels (dB). Thus, an input signal to amplifier 302 and/or amplifier 304 is amplified by a factor of 1,000.

Asymmetric input coupler 306 has a coupling ratio of 81% between the through port 314 and the coupled port 316. Thus, 19% of the incident power passes through the through port 314 and 81% of the incident power passes through the coupled port 316. For example, if the RF source signal delivered to input coupler 306 via connection 158 is equal to 1 milliwatt (mW), the signal delivered to first amplifier 302 via connection 318 has an amplitude of 0.19 mW and the signal delivered to the second amplifier 304 via connection 320 has an amplitude of 0.81 mW. Thus, the input coupler is a four-port asymmetric coupler that asymmetrically divides the RF source signal into two asymmetric signal components where the first signal component equals 19% of the RF source signal and the second signal component equals 81% of the RF source signal.

Output coupler 308 is configured substantially the same as the input coupler 306. However, output coupler 308 takes two signal components and combines them into one signal, the amplified RF output signal provided to RF subsystem 130 (FIG. 1) via connection 160. Continuing with the example above having the RF source signal equaled 1 mW, the 0.19 mW signal on connection 318 is amplified by first amplifier 302 into a 190 mW signal This 190 mW signal is delivered to through port 322 via connection 324. The 0.81 mW signal on connection 320 is amplified by the second amplifier 304 into an 810 mW signal. This 810 mW signal is delivered to coupled port 326 via connection 328. Output coupler 308 then combines the 190 mW signal and the 810 mW signal into a single RF output signal having an amplitude of 1,000 mW. This 1,000 mW RF output signal is transmitted on connection 160 out to the RF subsystem 130 (FIG. 1). For convenience of explaining the functionality of the multi-level power amplifier 300 shown in FIG. 3, the above-described signal amplitudes are shown on FIG. 3. The operation of the multi-level power amplifier 300 as described above represents operation in the high power mode.

When the multi-level power amplifier 300 is operating in the low power mode, the DC bias signal from DAC 138 (FIG. 1) provided over connection 144 is modified such that the second amplifier 304 is turned "off." That is, the 0.81 mW signal of the illustrated example above on connection 320 is not amplified. Thus, the output of second amplifier 304 provided on connection 328 equals 0 mW. Because first amplifier 302 is operating in the "on" condition, the output of first amplifier 302 on connection 324 equals 190 mW (in the illustrative example where the RF source signal amplitude equals 1 mW). Since there is no signal provided to coupled port 326, the output of the output coupler 308 equals the signal delivered to through port 322 only. Thus, the output of the multi-level power amplifier 300 is equal to 190 mW, and is delivered to RF subsystem 130 (FIG. 1) via connection 160.

In the multi-level power amplifier 300 the input coupler 306 and the output coupler 308 are shown to be like coupler units. The even-mode impedance ($Z_{oe}$) equals 176.32 ohms. The odd-mode impedance ($Z_{oo}$) equals 14.18 ohms. As noted above, the coupled port imparts a 90 degree phase shift, also known as electrical length (EL), to the RF signal. Other embodiments may employ asymmetric couplers having different coupling ratios, depending on the particular application requirements of the device that the invention is employed.

When the multi-level power amplifier 300 is operating in the low power mode (second amplifier 304 is off) terminating resistors 310 and 312 are used to limit current flowing through the coupled port 316 and the coupled port 326. In the multi-level power amplifier 300 the terminating resistors 310 and 312 are equal to 50 ohms. Terminating resistor 310 is coupled to the input of coupled port 316 via connection 330 and terminating resistor 312 is coupled to the output of coupled port 326 via connection 332.

5. Embodiment of a Multi-Level Power Amplifier Utilizing a Matching Impedance According to the multi-level power amplifier 300 shown in FIG. 3, when the second amplifier 304 is turned off, the apparent phase difference between the coupled ports 316 and 326, and the through ports 314 and 322, along with the impedance mismatch caused by turning off second amplifier 304, prevents the remaining operating amplifier 302 from providing its full power. For example, first amplifier 304 in such an arrangement might provide merely 20% to 25% of its possible power output.

Figure 4:
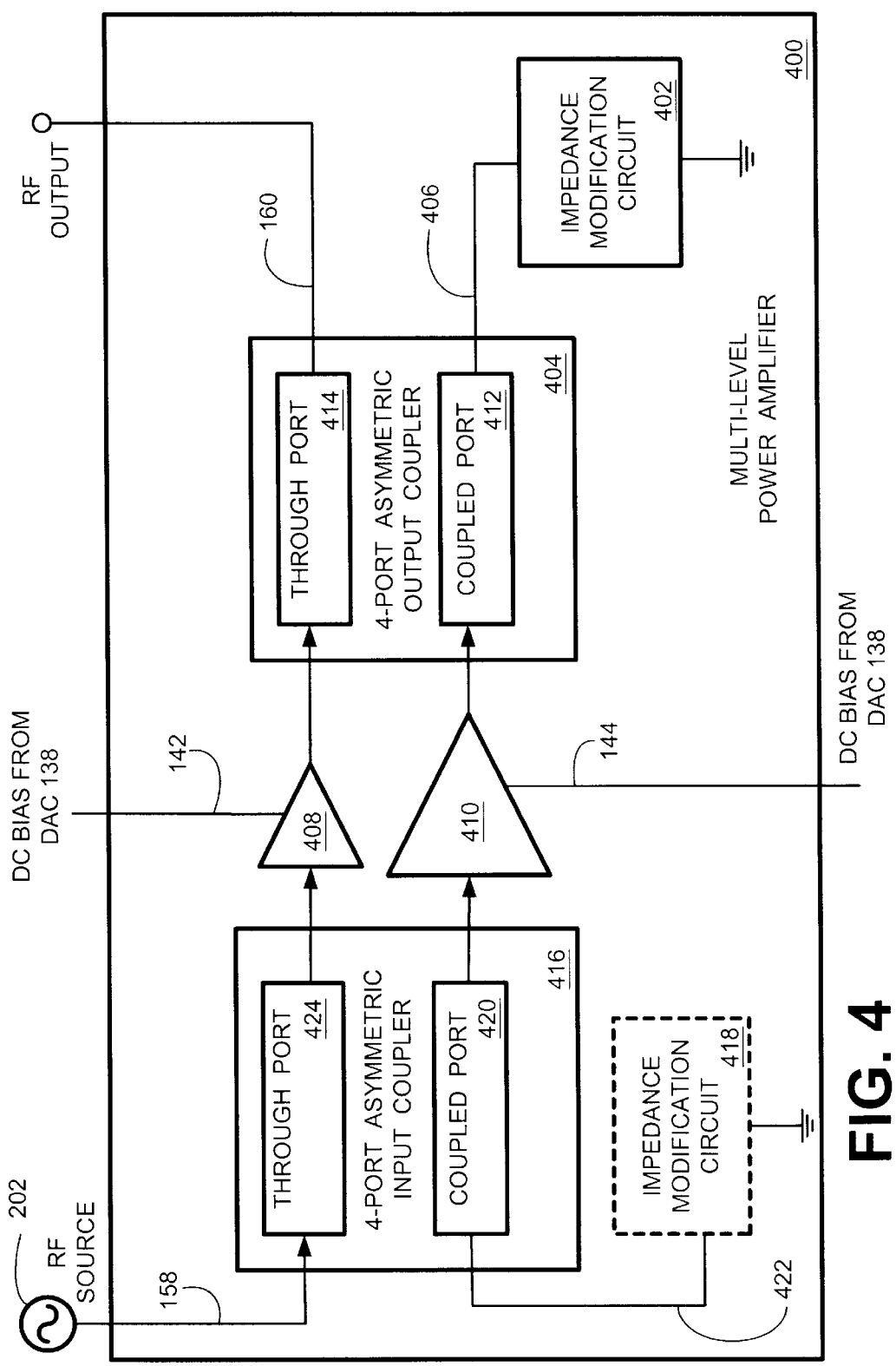
FIG. 4 is a block diagram illustrating an embodiment of the multi-level power amplifier having an impedance modification circuit.

FIG. 4 is a block diagram illustrating an embodiment of the multi-level power amplifier 400 having an impedance modification circuit 418. To improve the operating efficiency of the multi-level power amplifier 300 (FIG. 3), an impedance modification circuit 402 is connected to the isolated port of output coupler 404 via connection 406. The impedance modification circuit 402 (to be described in further detail below with respect to FIG. 4), operates in cooperation with amplifiers 408 and 410, so that when amplifier 410 is turned off, impedance modification circuit 402 presents a very high impedance to the coupled port 412 of output coupler 404. The high impedance allows the remaining operating amplifier (amplifier 408) to efficiently provide its full output power via connection 160. In other words, by changing the impedance at the coupled port 412 of Output coupler 404, significantly more power generated by amplifier 408 is available at the through port 414 of output coupler 404 via connection 160 than is possible without the impedance modification circuit 402. In this manner, the multi-level power amplifier 400 operates efficiently at both high power output and low power output.

6. Impedance Modification Circuit

Figure 5:
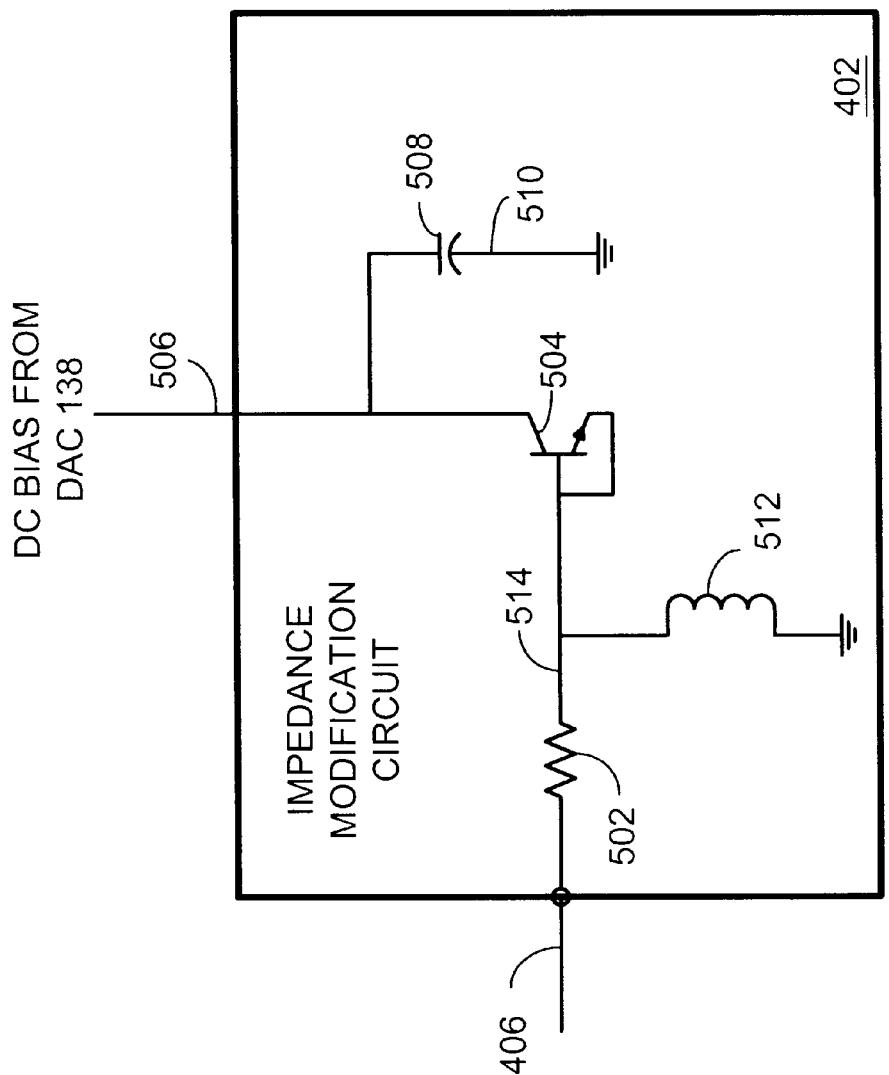
FIG. 5 is a schematic view illustrating, in further detail, an embodiment of the impedance modification circuit of FIG. 4.

FIG. 5 is a schematic view illustrating, in further detail, an embodiment of the impedance modification circuit 402 (FIG. 4). Impedance modification circuit 402 couples to the coupled port 402 of output coupler 404 (FIG. 4) via connection 406. A resistive element, such as a resistor 502 presents a load to the coupled port 412 (FIG. 4) of output coupler 404 at all times. In one embodiment, resistor 502 is equal to 50 ohms. When both amplifiers 408 and 410 are operating, the diode 504 of FIG. 5 is forward biased into a conductive state caused by a negative voltage applied via connection 506 (from DAC 138 of FIG. 1). Alternatively, the diode 504 can be forward biased by the negative components of the signal present on connection 406 if zero voltage is applied via connection 506. Forward biasing the diode 504 connects the resistor 502 through bypass capacitor 508, that behaves as a short circuit for AC signals, and connection 510 directly to ground. In this manner, an impedance resulting from resistor 502 is presented to the coupled port 412 of output coupler 404 at connection 406. If a zero volt signal is applied via connection 506, then any negative components of the signal present on connection 406 enables conduction through the diode 504.

When it is desirable to provide lower power from multi-level power amplifier 400 (FIG. 4), amplifier 410 (FIG. 4) is switched off via a control signal from connection 144 (FIG. 4) and, simultaneously therewith, diode 504 is reverse biased by the application of a positive voltage via connection 506 causing diode 504 to stop conducting. When diode 504 is reverse biased, an extremely high impedance is presented to the coupled port 412 of output coupler 404 (FIG.43) via resistor 502 and inductor 512, that behaves as an open circuit to the AC signal on connection 514. In this manner, all power generated by amplifier 408 (FIG. 4) is available at the output port of output coupler 404 via connection 160 (FIG. 4).

Advantageously, the diode 504 and the amplifiers 408 and 410 (FIG. 4) can be implemented using the same manufacturing processing technology. For example, gallium arsenide (GaAs) heterojunction bipolar transistor (HBT) technology can be used to fabricate both the diode 504 and the power amplifiers 408 and 410 on the same die or IC chip.

The input coupler 416 and the output coupler 404 (FIG. 4) form a "balanced amplifier" configuration. Under high power operation, both amplifiers 408 and 410 operate together, yielding an output power approximately equal to the sum of their individual output powers. Under low power operation, amplifier 408 and diode 504 are simultaneously switched off so that a high impedance is presented to the coupled port 412 of output coupler 404. This high impedance is fed back at the correct phase to the single remaining operating amplifier 408, that allows the amplifier 408 to be presented with a matched 50 ohm environment. In this manner, the single remaining amplifier 408 operates under optimal load conditions and delivers a power level approximately 3dB lower than that delivered when both amplifiers 408 and 410 are operating. Although illustrated using a diode to modify the impedance presented to the amplifier 408, other devices may be used to modify the impedance. For example, it is feasible to use an RF switch, a field effect transistor, or a bipolar device biased under different conditions to modify the impedance.

7. Embodiment Employing Two Impedance Modification Circuits

Referring to FIG. 4, impedance modification circuit 418 is coupled to the coupled port 420 of input coupler 416. The impedance modification circuit 418 connects via connection 422 to the coupled port 420 of input coupler 416. For convenience of illustration and to indicate that impedance modification circuit 418 is an optional element, impedance modification circuit 418 is shown with dotted lines. In the absence of impedance modification circuit 418, a fixed resistance may be connected to the coupled port 420 of input coupler 416. Impedance modification circuit 418 is similar in structure and operation to impedance modification circuit 402 described above with respect to FIG. 4.

8. Other Embodiments

While various embodiments of the invention have been described, it will be apparent to those of ordinary skill in the art that many more embodiments and implementations are possible that are within the scope of this invention.

What is claimed is:

1. A method for operating multiple output level power amplifiers, comprising the steps of:

providing a communication signal to an input coupler residing in a multiple output level power amplifier, the input coupler coupled to an input of a first power amplifier having a first amplification, and the input coupler coupled to an input of a second power amplifier having a second amplification, tie first amplification being smaller than the second amplification, specifying an amplification mode for amplification of the communication signal;

operating the multiple output level power amplifier in a high-power amplification mode such that the firs, power amplifier and the second power amplifier are operating to amplify the communication signal in accordance with tile specified amplification mode; and operating the multiple output level power amplifier in a low-power amplification mode such that the first power amplifier is operating to amplify the communication signal in accordance with the specified amplification mode and the second power amplifier is off.

2. The method of claim 1, further comprising the step of providing a control signal to the second power amplifier, the control signal having a first state such that the second power amplifier is off, and the control signal having a second state such that the second power amplifier is on.

3. The method of claim 2, further comprising the steps of:

modifying an output impedance to a first output impedance value of an output impedance modification circuit when the second power amplifier is operating, the output impedance modification circuit coupled to an output of an output coupler coupled to an output of the first power amplifier and coupled to an output of the second power amplifier; and modifying the output impedance to a second output impedance value when the second power amplifier is off.

4. The method of claim 3, further comprising the step of providing the control signal to the output impedance modification circuit, such that the output impedance is modified to the first output impedance value when the control signal is in the first state, and such that the output impedance is modified to the second output impedance value when the control signal is in the second state.

5. The method of claim 4, further comprising the steps of:

modifying an input impedance to a first input impedance value of an input impedance modification circuit coupled to an input of the input coupler when the second power amplifier is operating; and modifying the input impedance to a second input impedance value when the second power amplifier is off.

6. The method of claim 5, further comprising the step of providing the control signal to the input impedance modification circuit, such that the input impedance is modified to the first input impedance value when the control signal is in the first state, and such that the input impedance is modified to the second input impedance value when the control signal is in the second state.

7. A system for providing multiple output amplification levels in multiple output level power amplifiers, comprising:

an input coupler configured to receive a communication signal;

an output coupler configured to provide an amplified communication signal to an antennae, a first amplifier having a first amplification and coupled between the input coupler and the output coupler;

a second amplifier having a second amplification and coupled between the input coupler and the output coupler, the second amplification being greater than the first amplification; and a controller providing a control signal to the second amplifier such that when the control signal is in a first state the second amplifier is activated so that a multiple output level power amplifier is operating in a high-power amplification mode with the first amplifier and the second amplifier operating to amplify a communication signal, and such that when the control signal is in a second state the second amplifier is deactivated so that the multiple output level power amplifier is operating in a low power amplification mode with the first amplifier operating to amplify the communication signal and the second amplifier off.

8. The system of claim 7, wherein the input coupler is an input asymmetric coupler configured to transmit a first signal portion of the communication signal to an input of the first amplifier and configured to transmit a second signal portion of the communication signal to an input of the second amplifier, and wherein the output coupler is an output asymmetric coupler that combines an amplified first signal portion from an output of the first amplifier with an amplified second signal portion from an output of the second amplifier when the multiple output level power amplifier is operating in a high power output mode.

9. The system of claim 7, further comprising all output impedance modification circuit coupled to the output coupler such that when the control signal is in the first state the output impedance modification circuit has a first impedance value and such that when the control signal is in the second state the output impedance modification circuit has a second impedance value.

10. The system of claim 9, further comprising a coupler coupled between the output impedance modification circuit and the controller so that the control signal specifies the first impedance value and the second impedance value.

11. The system of claim 9, further comprising an input impedance modification circuit coupled to the input coupler such that when the control signal is in the first state the input impedance modification circuit has a first input impedance value and such that when the control signal is in the second state the input impedance modification circuit has a second input impedance value.

12. The system of claim 11, further comprising a coupler coupled between the input impedance modification circuit and the controller so that the control signal specifies the first input impedance value and the second input impedance value.

13. A system for providing multiple output amplification levels in multiple output level power amplifiers, comprising:

means for providing a communication signal to an input coupler residing in a multiple output level power amplifier, the input coupler coupled to an input of a first power amplifier having a first amplification, and the input coupler coupled to an input of a second power amplifier having a second amplification, the first amplification being smaller than the second amplification;

means for specifying an amplification mode for amplification of the communication signal;

means for operating the multiple output level power amplifier in a high-power amplification mode such that the first power amplifier and the second power amplifier are operating to amplify the communication signal in accordance with the specified amplification mode; and means for operating the multiple output level power amplifier in a low-power amplification mode such that the first power amplifier is operating to amplify the communication signal in accordance with the specified amplification mode and the second power amplifier is off.

14. The system of claim 13, further comprising means for providing a control signal to the second power amplifier, the control signal having a first state such that the second power amplifier is off, and the control signal having a second state such that the second power amplifier is on.

15. The system of claim 14, further comprising:

means for modifying an output impedance to a first output impedance value of an output impedance modification circuit when the second power amplifier is operating, the output impedance modification circuit coupled to an output of an output coupler coupled to an output of the first power amplifier and coupled to an output of the second power amplifier; and means for modifying the output impedance to a second output impedance value when the second power amplifier is off.

16. The system of claim 15, further comprising means for providing the control signal to the output impedance modification circuit, such that the output impedance is modified to the first output impedance value when the control signal is in the first state, and such that the output impedance is modified to the second output impedance value when the control signal is in the second state.

17. The system of claim 16, further comprising:

means for modifying an input impedance to a first input impedance value of an input impedance modification circuit coupled to an input of the input coupler when the second power amplifier is operating; and means for modifying the input impedance to a second input impedance value when the second power amplifier is off.

18. The system of claim 17, further comprising means for providing the control signal to the input impedance modification circuit, such that the input impedance is modified to the first input impedance value when the control signal is in the first state and such that the input impedance is modified to the second input impedance value when the control signal is in the second state.

19. A system for controlling transmitter power, comprising:

a wireless communication device having a multiple output level power amplifier, the multiple output level power amplifier further comprising;

an input coupler configured to receive a communication signal;

an output coupler configured to provide an amplified communication signal to an antennae, a first amplifier having a first amplification and coupled between the input coupler and the output coupler;

a second amplifier having a second amplification and coupled between the input coupler and the output coupler, the second amplification being greater than the first amplification; and a controller providing a control signal to the second amplifier such that when the control signal is in a first state the second amplifier is activated so that the multiple output level power amplifier is operating in a high-power amplification mode with the first amplifier and the second amplifier operating to amplify a communication signal, and such that when the control signal is in a second state the second amplifier is deactivated so that the multiple output level power amplifier is operating in a low power amplification mode with the first amplifier operating to amplify the communication signal and the second amplifier off.

20. The system for controlling transmitter power in a wireless communication device of claim 19, wherein the wireless communication device is a cellular telephone.

* * * * *

UNITED STATES PATENT AND TRADEMARK OFFICE
CERTIFICATE OF CORRECTION

PATENT NO. : 6,515,541 B2
DATED : February 4, 2003
INVENTOR(S) : Cheng et al.

It is certified that error appears in the above-identified patent and that said Letters Patent is hereby corrected as shown below:

Column 1,
Line 23, after the word "systems" delete the phrase "arc", and substitute therefor
-- are --.

Column 2,
Line 8, after the word "levels", delete the words "a hat", and substitute therefor
-- That --.

Column 4,
Line 13, after the numeral "108", delete the word "ail", and substitute therefor -- All --.

Column 7,
Lins 5-6, after the word "impedance", delete the word "Such", and substitute therefor
-- such --.

Column 9,
Line 43, after the word "of", delete the word "Output" and substitute therefor
-- output --.

Column 10,
Lines 14-15, after the numeral "404", delete the phrase "(FIG.43)", and substitute
therefor -- (FIG 4) --.

Column 11,
Line 9, after the word "amplification", delete the word "tie", and substitute therefor
-- the --.
Line 14, after the word "the", delete the word "firs", and substitute therefor -- first --.
Line 18, after the word "with", delete the word "tile", and substitute therefor -- the --.

Signed and Sealed this

Twenty-fourth Day of June, 2003

JAMES E. ROGAN
*Director of the United States Patent and Trademark Office*